United States Patent
Kim et al.

(10) Patent No.: US 9,923,123 B2
(45) Date of Patent: Mar. 20, 2018

(54) PRINTED CIRCUIT BOARD AND LIGHT-EMITTING DEVICE INCLUDING SAME

(71) Applicant: LG INNOTEK CO., LTD., Seoul (KR)

(72) Inventors: Jeong Han Kim, Seoul (KR); Jeung Ook Park, Seoul (KR); Sang In Yoon, Seoul (KR); Hyun Gu Im, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/303,445

(22) PCT Filed: Mar. 27, 2015

(86) PCT No.: PCT/KR2015/003047
§ 371 (c)(1),
(2) Date: Nov. 17, 2016

(87) PCT Pub. No.: WO2015/156522
PCT Pub. Date: Oct. 15, 2015

(65) Prior Publication Data
US 2017/0069798 A1     Mar. 9, 2017

(30) Foreign Application Priority Data
Apr. 10, 2014  (KR) .......................... 10-2014-0043066

(51) Int. Cl.
*H01L 33/44*     (2010.01)
*H01L 33/00*     (2010.01)
(Continued)

(52) U.S. Cl.
CPC .............. *H01L 33/44* (2013.01); *H01L 33/00* (2013.01); *H01L 33/38* (2013.01); *H01L 33/62* (2013.01);
(Continued)

(58) Field of Classification Search
CPC ....... H01L 33/44; H01L 33/62; H01L 33/642; H01L 33/38; H01L 33/00; H05K 1/183; H05K 1/02; H05K 1/18
See application file for complete search history.

(56) References Cited

U.S. PATENT DOCUMENTS

2003/0193055 A1   10/2003 Martter et al.
2007/0246715 A1   10/2007 Shin et al.
(Continued)

FOREIGN PATENT DOCUMENTS

EP   1 892 773   2/2008
EP   2 445 024   4/2012
(Continued)

OTHER PUBLICATIONS

International Search Report and Written Opinion dated Jun. 29, 2015 issued in Application No. PCT/KR2015/003047 (with English translation).
(Continued)

*Primary Examiner* — Roy Potter
*Assistant Examiner* — Paul Patton
(74) *Attorney, Agent, or Firm* — Ked & Associates LLP

(57) ABSTRACT

A printed circuit board having an improved heat radiation performance, and a light-emitting device including the same are provided. The printed circuit board includes a first electrode layer, a first insulation layer disposed on one surface of the first electrode layer, and a second electrode layer disposed on the first insulation layer. The first insulation layer includes a cavity formed through a part thereof. At least a portion of the one surface of the first electrode layer may be exposed to the outside through the cavity.

19 Claims, 6 Drawing Sheets

(51) Int. Cl.
*H05K 1/02* (2006.01)
*H05K 1/18* (2006.01)
*H01L 33/38* (2010.01)
*H01L 33/62* (2010.01)
*H01L 33/64* (2010.01)

(52) U.S. Cl.
CPC ............ *H01L 33/642* (2013.01); *H05K 1/02* (2013.01); *H05K 1/18* (2013.01); *H05K 1/183* (2013.01)

(56) References Cited

U.S. PATENT DOCUMENTS

| | | | |
|---|---|---|---|
| 2009/0267505 | A1 | 10/2009 | Lee et al. |
| 2010/0258838 | A1* | 10/2010 | Chiang ................ H01L 33/486 257/99 |
| 2011/0063816 | A1 | 3/2011 | Tanabe et al. |
| 2013/0107480 | A1 | 5/2013 | Bibee |
| 2013/0121000 | A1* | 5/2013 | Lee ......................... H01L 33/56 362/293 |
| 2014/0021851 | A1 | 1/2014 | Heo |

FOREIGN PATENT DOCUMENTS

| | | |
|---|---|---|
| JP | 2012-238698 | 12/2012 |
| JP | 2013-254877 | 12/2013 |

OTHER PUBLICATIONS

European Search Report dated Nov. 7, 2017.

\* cited by examiner

PRINTED CIRCUIT BOARD AND LIGHT-EMITTING DEVICE INCLUDING SAME

CROSS-REFERENCE TO RELATED PATENT APPLICATIONS

This application is a U.S. National Stage Application under 35 U.S.C. § 371 of PCT Application No. PCT/KR2015/003047, filed Mar. 27, 2015, which claims priority to Korean Patent Application No. 10-2014-0043066, filed Apr. 10, 2014, whose entire disclosures are hereby incorporated by reference.

TECHNICAL FIELD

The present invention relates to a printed circuit board and a light-emitting device including the same.

BACKGROUND ART

A luminous element is an element which converts electric current into light. Representative examples of luminous element include a light-emitting diode (LED), a semiconductor laser diode (LD), etc.

The LED is a device in which, when current is supplied thereto, electrons and holes meet at a P-N semiconductor junction (a P-N junction) and generate light. In general, the LED is manufactured in a structure of a module having an LED thereon. An LED module is mounted on a printed circuit board (PCB) to generate light when current is supplied to the LED module from an electrode formed on the PCB.

The light-emitting performance and lifespan of such an LED module are directly influenced by heat generated by an LED. When the heat generated by the LED stays longer in the LED, dislocation, mismatch, and the like occur in a crystalline structure of the LED, thereby decreasing the lifespan of the LED.

Thus, many techniques have been introduced to promote dissipation of heat generated by an LED. For example, an LED package in which a ceramic substrate is combined with an LED chip may be mounted on a PCB, or an aluminum oxide ($Al_2O_3$) insulation layer may be formed by anodizing an aluminum substrate and an LED chip may be mounted according to a chip-on-board (COB) method.

An aluminum nitride (AlN) which is an expensive nitride-based material may be used for a ceramic substrate applied to an LED package. In order to secure durability, the ceramic substrate should be formed to a thickness of 400 μm or more. Thus, when the ceramic substrate is applied to the LED package, manufacturing costs increase and decreasing thermal resistance in a vertical direction is limited.

In the COB method using an $Al_2O_3$ insulation layer, an expensive ceramic substrate may be omitted to decrease manufacturing costs. However, higher thermal resistance and lower withstand voltage characteristics may be exhibited than when the ceramic substrate is applied. Thus, high heat radiation performance is difficult to be achieved and thus the COB method is difficult to be applied to a high-power product, such as a head lamp, which generates a large amount of heat.

DISCLOSURE

Technical Problem

The present invention is directed to providing a printed circuit board having improved heat radiation performance and a light-emitting device including the same.

Technical Solution

One aspect of the present invention provides a printed circuit board including a first electrode layer; a first insulation layer provided on one surface of the first electrode layer; a cavity passing through the first insulation layer; and a second electrode layer provided on the first insulation layer, wherein at least a portion of the one surface of the first electrode layer is exposed to the outside via the cavity.

When a semiconductor element is disposed on the one surface of the first electrode layer exposed via the cavity, the first electrode layer may discharge heat generated by the semiconductor element to the outside.

The printed circuit board may include a first protective layer provided on at least a region of the one surface of the first electrode layer having thereon the first insulation layer and the second electrode layer.

The first protective layer may be provided in a region excluding the cavity.

The first protective layer may be provided to cover at least a portion of a side surface of the first electrode layer.

The printed circuit board may further include a second insulation layer provided on at least a region of the other surface opposite to the one surface of the first electrode layer.

The printed circuit board may further include a second protective layer provided on at least a region of the second insulation layer.

The second insulation layer may include a heat-conductive insulating material.

The second protective layer may include aluminum.

The printed circuit board may further include a connector unit provided at a side of the first electrode layer and formed to expose regions of the first and second electrode layers to the outside.

In the connector unit, the first insulation layer may be formed to expose at least a portion of the one surface of the first electrode layer to the outside.

Another aspect of the present invention provides a light-emitting device including a printed circuit board; at least one luminous element provided on one surface of a first electrode layer; and a conductive adhesive layer interposed between the one surface of the first electrode layer and the at least one luminous element. The printed circuit board includes the first electrode layer; a first insulation layer provided on the one surface of the first electrode layer; and a second electrode layer provided on the first insulation layer. One surface of the conductive adhesive layer is directly in contact with the one surface of the first electrode layer, and the other surface opposite to the one surface of the conductive adhesive layer is directly in contact with the at least one luminous element.

The light-emitting device may further include a first protective layer provided on at least a region of the one surface of the first electrode layer having thereon the first insulation layer and the second electrode layer. The first protective layer may cover at least a portion of a side surface of the first electrode layer connected to the one surface of the first electrode layer.

The light-emitting device may further include a connector unit provided at a side of the printed circuit board and formed to expose regions of the first and second electrode layers to the outside.

The connector unit may be attachable to and detachable from a connector including first and second electrode terminals. The first electrode terminal of the connector may be in contact with the exposed region of the first electrode layer, and the second electrode terminal of the connector may be in contact with the exposed region of the second electrode layer.

One of an anode terminal and a cathode terminal of each of the at least one luminous element may be electrically connected to the first electrode layer, and the other of the anode terminal and the cathode terminal of each of the at least one luminous element may be electrically connected to the second electrode layer.

The at least one luminous element may be provided on the one surface of the first electrode layer via a cavity passing through the first insulation layer.

A plurality of luminous elements may be provided on the one surface of the first electrode layer. The plurality of luminous elements may be electrically connected in parallel to the first electrode layer and the second electrode layer.

A plurality of luminous elements may be provided on the one surface of the first electrode layer. One of an anode terminal and a cathode terminal of each of the plurality of luminous elements may be electrically connected in parallel to the first electrode layer, and the other of the anode terminal and the cathode terminal of each of the plurality of luminous elements may be electrically connected in parallel to the second electrode layer.

Another aspect of the present invention provides a light-emitting device including a printed circuit board; and at least one luminous element provided on one surface of a first electrode layer via a cavity. The printed circuit board includes the first electrode layer; a first insulation layer provided on the one surface of the first electrode layer; the cavity passing through the first insulation layer; and a second electrode layer provided on the first insulation layer.

Advantageous Effects

According to an embodiment of the present invention, a luminous element is directly bonded to a first electrode layer of a printed circuit board so that the first electrode layer may serve as an electrode while performing a heat radiation function. Thus, a heat radiation path of the luminous element may decrease to improve the heat radiation performance of the printed circuit board.

One of two electrode terminals of the luminous element is connected to the printed circuit board by wire bonding or the like and the other is directly bonded to the printed circuit board. Thus, a structure connecting the electrode terminals and the printed circuit board may be simplified.

Furthermore, a connector unit is formed on the PCB, through which the PCB may be coupled to an external connector terminal. Thus, a method of connecting the PCB and the external connector terminal is simpler than a soldering connection method, and an electrode space for soldering is not needed, thereby efficiently reducing manufacturing costs.

In addition, a ceramic substrate may be omitted in a luminous element package, thereby reducing manufacturing costs.

MODES OF THE INVENTION

Figure 1:
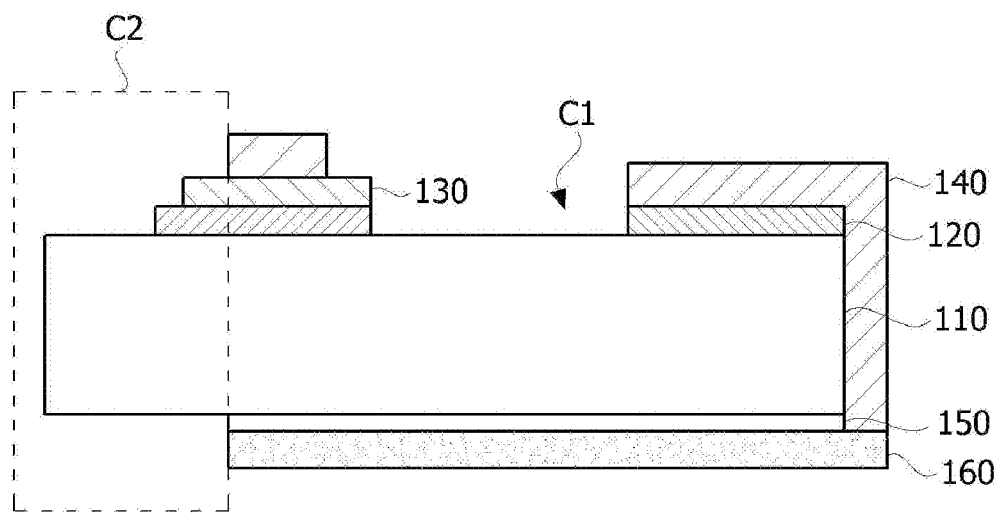
FIG. 1 is a cross-sectional view of a printed circuit board according to an embodiment of the present invention.

The present invention may be embodied in many different forms and performed in various embodiments. Hereinafter, exemplary embodiments are illustrated in the drawings and described herein. However, the present invention is not limited thereto and should be understood to cover all modifications, equivalents, and alternatives falling within the idea and technical scope of the invention.

It will be understood that, although the terms 'first', 'second', etc. may be used herein to describe various elements, these elements should not be limited by these terms. These terms are only used to distinguish one element from another element. For example, a first element could be termed a second element, and, similarly, a second element could be termed a first element, without departing from the scope of the present invention. As used here, the term 'and/or' includes any and all combinations of one or more of the associated listed items.

In the following description, the expressions 'module' and 'unit' are merely added or used to easily prepare the present specification and are not used to represent different meanings or to do different roles.

It will be understood that when an element is referred to as being 'connected' or 'coupled' to another element, it can be directly connected or coupled to the other element or intervening elements may be present. In contrast, when an element is referred to as being 'directly connected' or 'directly coupled' to another element, there are no intervening elements present.

It will be understood that when an element or layer is referred to as being 'on' another element or layer, the element or layer can be directly on another element or layer or intervening elements or layers may be present. In contrast, when an element is referred to as being 'directly on' another element or layer, there are no intervening elements or layers present.

The terminology used herein is for the purpose of describing particular embodiments only and is not intended to be limiting of the invention. As used herein, the singular forms 'a', 'an' and 'the' are intended to include the plural forms as well, unless the context clearly indicates otherwise. It will be further understood that the terms 'comprise' and/or 'comprising,' when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined here.

Hereinafter, embodiments will be described in detail with reference to the accompanying drawings. The same or corresponding elements are assigned the same reference numerals and are not redundantly described herein.

Figure 2:
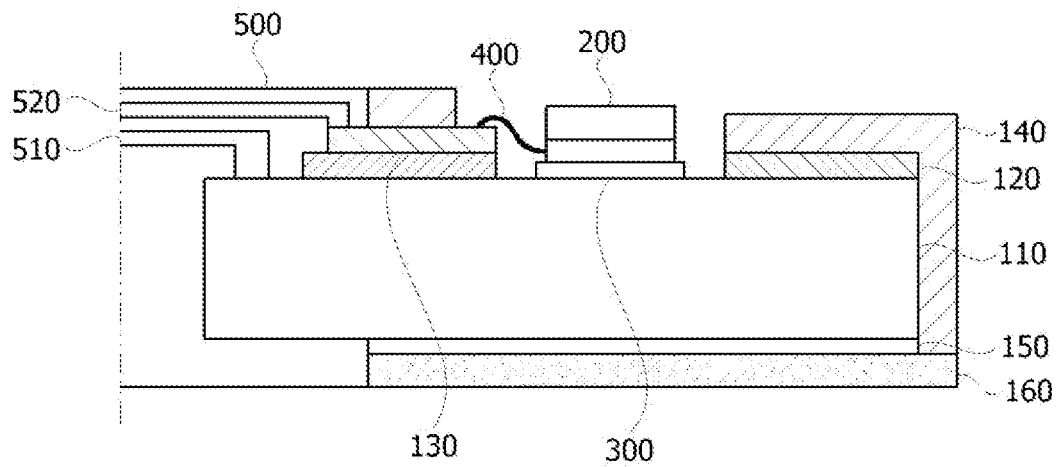
FIG. 2 is a cross-sectional view of a light-emitting device according to an embodiment of the present invention.

FIG. 1 is a cross-sectional view of a printed circuit board (PCB) according to an embodiment of the present invention. FIG. 2 is a cross-sectional view of a light-emitting device including a PCB therein according to an embodiment of the present invention.

Referring to FIGS. 1 and 2, a PCB 100 according to an embodiment of the present invention may include a first electrode layer 110, a first insulation layer 120, a cavity C1 passing through the first insulation layer 120, a second electrode layer 130, and a first protective layer 140.

Figure 3:
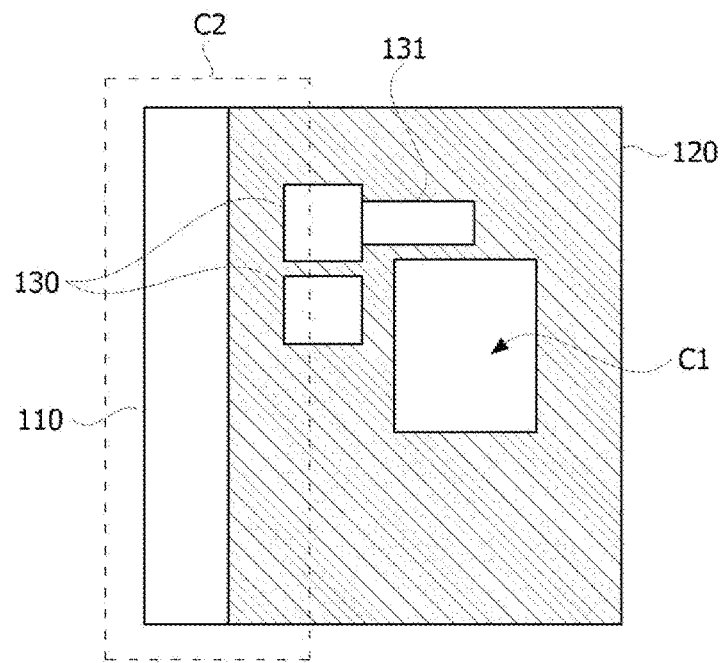
FIG. 3 is a plan view of a structure in which a first insulation layer and a second electrode layer are stacked on a first electrode layer.
Figure 4:
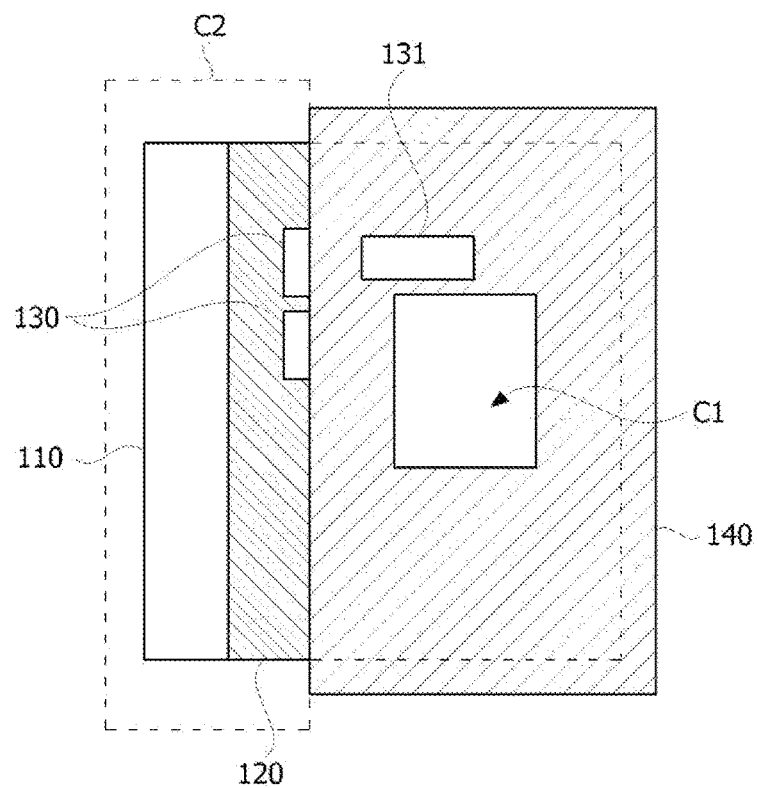
FIG. 4 is a plan view of a stack state including a first protective layer on the structure of FIG. 3.
Figure 5:
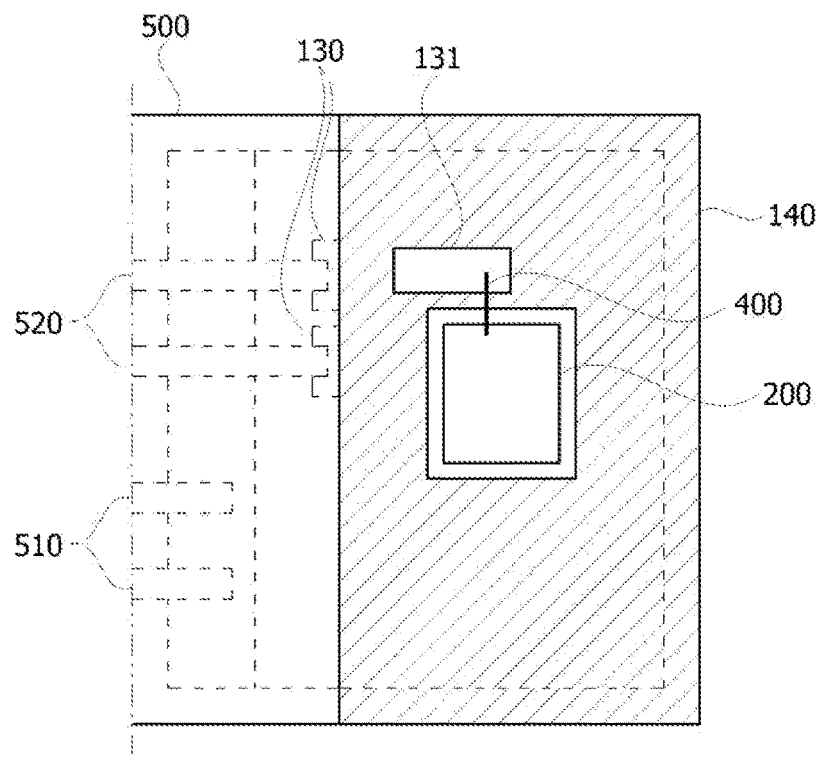
FIG. 5 is a plan view of a light-emitting device according to an embodiment of the present invention.

The PCB 100 of FIG. 1 and a light-emitting device of FIG. 2 will be described below in conjunction with FIGS. 3 to 5. FIG. 3 is a plan view of a structure in which the first insulation layer 120 and the second electrode layer 130 are stacked on the first electrode layer 110. FIG. 4 is a plan view illustrating a stack state including the first protective layer 140. FIG. 5 is a diagram illustrating a light-emitting device according to an embodiment of the present invention. FIG. 5 is a plan view of FIG. 2.

The first electrode layer 110 is disposed as a base element of the PCB 100, and may perform a heat radiation function of discharging heat generated by the luminous element 200 to the outside while serving as a first electrode of the PCB 100.

To this end, the first electrode layer 110 may be formed of either copper (Cu) having low thermal resistance, high heat conductivity, and electrical conductivity or a CU alloy. However, the first electrode layer 110 is not limited thereto and may be formed of any material having both heat conductivity and electrical conductivity.

The first insulation layer 120 may be provided on one surface of the first electrode layer 110. More specifically, the first insulation layer 120 may be provided on at least a region of the one surface of the first electrode layer 110.

The first insulation layer 120 may be coupled onto the first electrode layer 110 in various ways. In one embodiment, the first insulation layer 120 may be formed by vacuum sputtering, formed by stacking it in a provisionally hardened state and completely hardening it through compression, or formed by applying it in a liquid state and hardening it.

In the present disclosure, the terms 'one surface', 'other surface', and 'side surface' are used to differentiate a plurality of surfaces of the first electrode layer 110 from one another. Here, the "one surface" may mean one of the plurality of surfaces of the first electrode layer 110, the "other surface" may mean a surface opposite to the one surface of the first electrode layer 110, and the "side surface" may mean a side surface of the first electrode layer 110 which connects the one surface and the other surface. However, these terms are merely used to indicate the plurality of surfaces of the first electrode layer 110 and the present invention is not limited thereto.

The first insulation layer 120 may prevent the first electrode layer 110 and the second electrode layer 130 from being electrically connected to each other. Thus, the first insulation layer 120 forms an insulating pattern corresponding to the shape of the second electrode layer 130. The area of the insulating pattern may be differently designed according to the second electrode layer 130.

To achieve an insulating function, the first insulation layer 120 may be formed of a non-conductive material. In one embodiment, the first insulation layer 120 may be formed of a resin, epoxy, polyester resin, polyimide resin, or the like.

At least one cavity C1 is formed to pass through the first insulation layer 120. The cavity C1 may be formed to pass through the first insulation layer 120 such that the at least one cavity C1 corresponds to a space in which the luminous element 200 is located so as to accommodate the luminous element 200. That is, the at least one cavity C1 may be in the form of an opening, through which a portion of the one surface of the first electrode layer 110 may be exposed to the outside.

As the at least one cavity C1 is formed, the first insulation layer 120 between the first electrode layer 110 and the luminous element 200 may be removed to prevent the occurrence of a thermal resistance element caused by the first insulation layer 120. That is, as the at least one cavity C1 is formed, heat generated by the luminous element 200 may be directly transmitted to the first electrode layer 110, thereby improving the heat radiation performance of the PCB 100.

In one embodiment, the at least one cavity C1 may be formed according to a cutting process using laser equipment, a computerized numeral control (CNC) milling process, a punching process, or the like during or after stacking of the first insulation layer 120.

The second electrode layer 130 may be provided on the first insulation layer 120. More specifically, the second electrode layer 130 may be provided on at least one region of the first insulation layer 120.

The second electrode layer 130 may be formed of a conductive metal. In one embodiment, the second electrode layer 130 may be formed of copper, a copper alloy containing copper as a main ingredient, or the like.

A wire 400 of the luminous element 200 may be directly bonded onto the second electrode layer 130. A bonding pad 131 for bonding the wire 400 of the luminous element 200 may be additionally provided on the second electrode layer 130. The bonding pad 131 may extend from the second electrode layer 130 or be connected to the second electrode layer 130.

Although not shown in the drawings, a seed layer may be formed between the first insulation layer 120 and the second electrode layer 130. The seed layer is a layer which increases adhesion between the first insulation layer 120 and the second electrode layer 130, and may be formed of nickel-chromium (Ni—Cr) or the like.

The first electrode layer 110 and the second electrode layer 130 formed as described above form opposite electrodes of the PCB 100. That is, the second electrode layer 130 may be set to a cathode electrode when the first electrode layer 110 is set to an anode electrode, and may be set to an anode electrode when the first electrode layer 110 is set to a cathode electrode.

The first and second electrode layers 110 and 130 may be respectively electrically connected to opposite electrode terminals (i.e., an anode terminal and a cathode terminal) of the luminous element 200.

The first protective layer 140 may be formed on at least a region of the one surface of the first electrode layer 110 having the first insulation layer 120 and the second electrode layer 130 thereon. In this case, the first protective layer 140 may provide a space for accommodating the luminous element 200, and may be disposed in a region excluding the at least one cavity C1 to discharge light generated by the luminous element 200 to the outside.

The first protective layer 140 may perform an electrical insulation function and an electrical/physical shock relieving function on the first and second electrode layers 110 and 130. Thus, the first protective layer 140 may be formed to cover at least a region of a side surface of the first electrode layer 110.

The first protective layer 140 may be formed as a solder mask, or may be formed using solder resist, coverlay, or the like.

A second insulation layer 150 may be formed on at least a region of the other surface of the first electrode layer 110.

The second insulation layer 150 may be formed of a heat-conductive insulating material to electrically insulate the first electrode layer 110 and effectively discharge heat generated by the luminous element 200 and transmitted to the first electrode layer 110.

A second protective layer 160 may be formed on at least a region of the second insulation layer 150.

The second protective layer 160 may be selectively employed to protect the other surface of the first electrode layer 110 and the second insulation layer 150 and discharge heat of the second insulation layer 150 to the outside.

In one embodiment, when the second insulation layer 150 is formed of an adhesive material to be attachable to and detachable from an external device, the second protective layer 160 may be unnecessary. This is because the external device to which the second insulation layer 150 is attached may perform a function of the second protective layer 160, and when the PCB 100 is formed to be attachable and detachable, the second protective layer 160 may deteriorate this feature of the PCB 100.

In another embodiment, when the second insulation layer 150 is formed of an adhesive material, the second protective layer 160 may be provided.

The second protective layer 160 may include aluminum. In one embodiment, the second protective layer 160 may be formed of an aluminum (Al) thin film, i.e., aluminum foil, or the like.

A connector unit C2 may be formed at a side of the PCB 100 according to one embodiment of the present invention. The connector unit C2 is a region connected to an external connector 500.

In the related art, in order to connect a circuit pattern of the PCB 100 to an external power source, a wire connected to the external power source is soldered onto the circuit pattern. Thus, it is inconvenient to connect the external power source and the PCB 100 to each other, clearance should be secured in the circuit pattern for a soldering region, and a contact failure rate is very high due to characteristics of a soldering method.

In one embodiment of the present invention, a connector attaching/detaching method is employed rather than the soldering method.

To this end, the connector unit C2 may be provided at a side of the PCB 100.

In the connector unit C2, the first insulation layer 120 may be formed to expose a region of the first electrode layer 110 to the outside, and the second electrode layer 130 may be formed such that a region thereof is exposed to the outside. That is, in the connector unit C2, a contact region may be provided, through which electrode terminals 510 and 520 in the external connector 500 and the first and second electrode layers 110 and 130 are electrically in contact with one another.

Through the contact region, as illustrated in FIG. 2, when the connector unit C2 is inserted into the external connector 500, the exposed region of the first electrode layer 110 may be electrically connected to the first electrode terminal 510 of the external connector 500 and the exposed region of the second electrode layer 130 may be electrically connected to the second electrode terminal 520 of the external connector 500. That is, in the present invention, the first and second electrode layers 110 and 130 are provided to form a step while having the first insulation layer 120 therebetween and thus a connection method using the external connector 500 may be applied.

Figure 6:
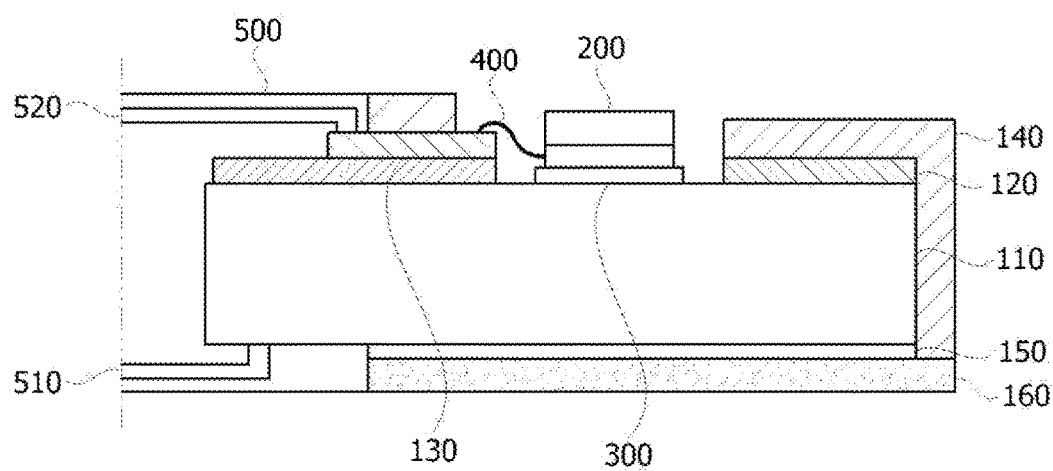
FIG. 6 is a cross-sectional view illustrating a connector attaching/detaching method according to another embodiment of the present invention.

FIG. 6 is a diagram illustrating a connector attaching/detaching method according to another embodiment of the present invention.

Referring to FIG. 6, a first electrode terminal 510 of an external connector 500 may be formed to be in contact with the other surface of the first electrode layer 110. In this case, in the connector unit C2, the first insulation layer 120 may entirely cover the one surface of the first electrode layer 110 if necessary.

Since in the present invention, the first electrode layer 110 serves as not only the base element of the PCB 100 but also an electrode, all the one surface, the other surface, and side surfaces of the first electrode layer 110 may be electrically connected to the external connector 500. Thus, the embodiment of FIG. 6 may be realized.

The connector unit C2 may be designed to have the same specifications as those of the external connector 500 to be precisely connected to the external connector 500.

The first protective layer 140 described above may be provided to cover both the exposed regions of the first and second electrode layers 110 and 130 in a region excluding the connector unit C2. That is, since both the first and second electrode layers 110 and 130 serve as circuit patterns, the first protective layer 140 may electrically insulate the first and second electrode layers 110 and 130 from the outside and protect them from electrical/physical shocks.

Although it is illustrated in FIGS. 1 and 2 that the second insulation layer 150 and the second protective layer 160 are formed in regions excluding the connector unit C2, this is merely an embodiment of the present invention and the second insulation layer 150 and the second protective layer 160 may be formed to extend to the connector unit C2. However, when the first electrode terminal 510 of the external connector 500 is formed to be in contact with the other surface of the first electrode layer 110 as in the embodiment of FIG. 6, the second insulation layer 150 and the second protective layer 160 may be formed in a region other than a region in which the first electrode terminal 510 is in contact with the first electrode layer 110.

The luminous element 200 may be mounted on the first electrode layer 110 according to a COB method which does not use a ceramic substrate. In detail, the luminous element 200 may be mounted on the one surface of the first electrode layer 110 exposed via the at least one cavity C1 passing through the first insulation layer 120, and accommodated in the at least one cavity C1.

In this case, the luminous element 200 may be adhered onto the first electrode layer 110 through a conductive adhesive layer 300. The conductive adhesive layer 300 may be formed of an adhesive having electrical conductivity, e.g., a metal paste or the like. One surface of the conductive adhesive layer 300 may be directly in contact with the one surface of the first electrode layer 110, and the other surface thereof may be directly in contact with the luminous element 200. That is, the luminous element 200 and the first electrode layer 110 may be directly bonded to each other via the conductive adhesive layer 300 interposed therebetween.

One of the opposite electrode terminals of the luminous element 200 may be electrically connected to the first electrode layer 110 via the conductive adhesive layer 300. That is, one of the anode terminal and the cathode terminal of the luminous element 200 is connected to the second electrode layer 130 by wire bonding using the wire 400 and the other is connected to the first electrode layer 110 via the conductive adhesive layer 300.

In the related art, since both circuit patterns of opposite electrodes are formed on an insulation layer of the PCB 100, it is inconvenient to form the circuit patterns. Furthermore, the anode terminal and the cathode terminal of the luminous element 200 should be respectively wire-bonded to the circuit patterns, thereby complicating a manufacturing process. Thus, when a plurality of luminous elements 200 are provided, a wire bonding process becomes more complicated.

However, since in an embodiment of the present invention, one of the opposite terminals of the luminous element 200 is connected to the second electrode layer 130 through wire bonding and the other is directly connected to the first electrode layer 110 as described above, the structure of the PCB 100 is far simpler than that of the related art. The method according to the embodiment of the present invention is more efficient when a plurality of luminous elements 200 are disposed.

Figure 7:
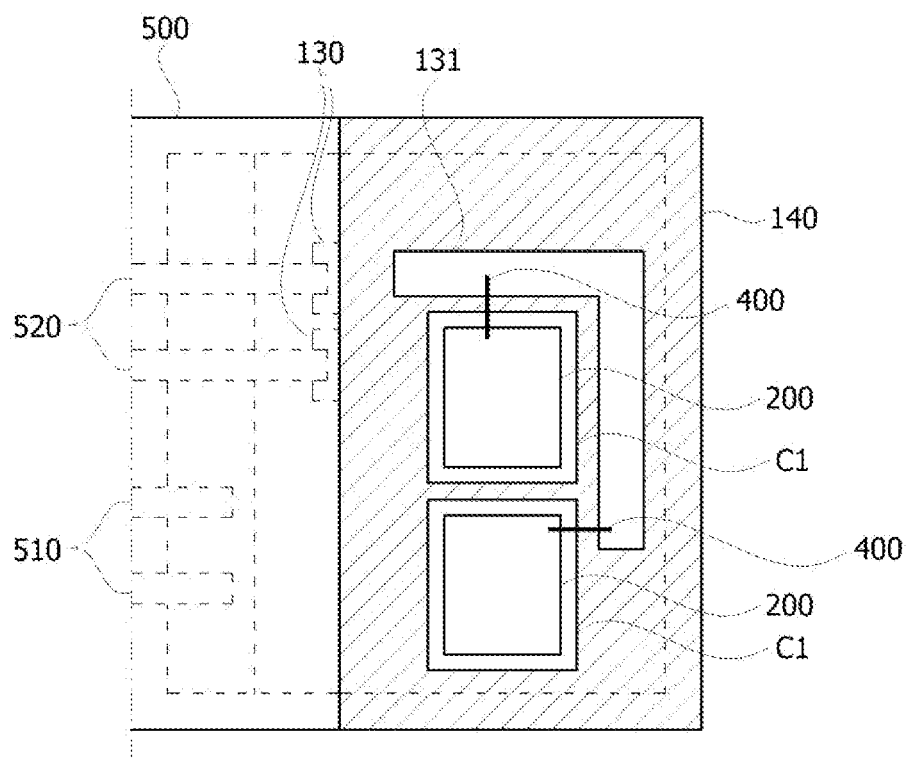
FIGS. 7 and 8 are plan views of light-emitting devices according to other embodiments of the present invention.
Figure 8:
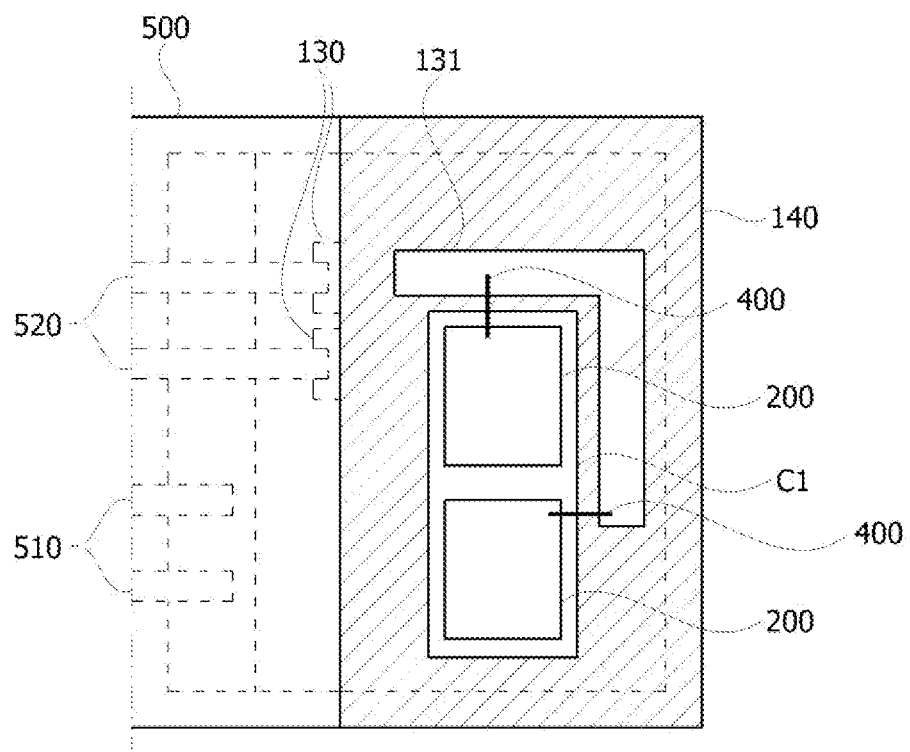

FIGS. 7 and 8 are diagrams illustrating embodiments in which a plurality of luminous elements 200 are provided on a PCB 100.

FIGS. 2 and 5 illustrate that one luminous element 200 is mounted in the PCB 100 and is accommodated in one cavity C1, but embodiments of the present invention are not limited thereto. In another embodiment of the present invention, a plurality of cavities C1 passing through the first insulation layer 120 may be formed and thus at least one luminous element 200 may be accommodated in each of the plurality of cavities C1 as illustrated in FIG. 7. In another embodiment, a plurality of luminous elements 200 may be accommodated in one cavity C1 as illustrated in FIG. 8.

Referring to FIGS. 7 and 8, when a plurality of luminous elements 200 are mounted on the PCB 100, opposite electrode terminals of each of the plurality of luminous elements 200 may be electrically connected in parallel to the first and second electrode layers 110 and 130.

That is, one of the opposite electrodes of each of the plurality of luminous elements 200 may be directly connected to the first electrode layer 110 via the conductive adhesive layer 300, and the other may be connected to the second electrode layer 130 via the wire 400.

Although in a method of connecting electrodes to the second electrode layer 130, electrodes of the plurality of luminous elements 200 are wire-bonded to the bonding pad 131 connected to the second electrode layer 130 in the embodiments of FIGS. 7 and 8, the method of connecting the electrodes to the second electrode layer 130 is not limited thereto and all general electrode connecting methods may be applied.

A light-emitting device according to an embodiment of the present invention is applicable to a head lamp for use in a vehicle, a backlight unit of a display device, a household illumination device, etc.

Figure 9:
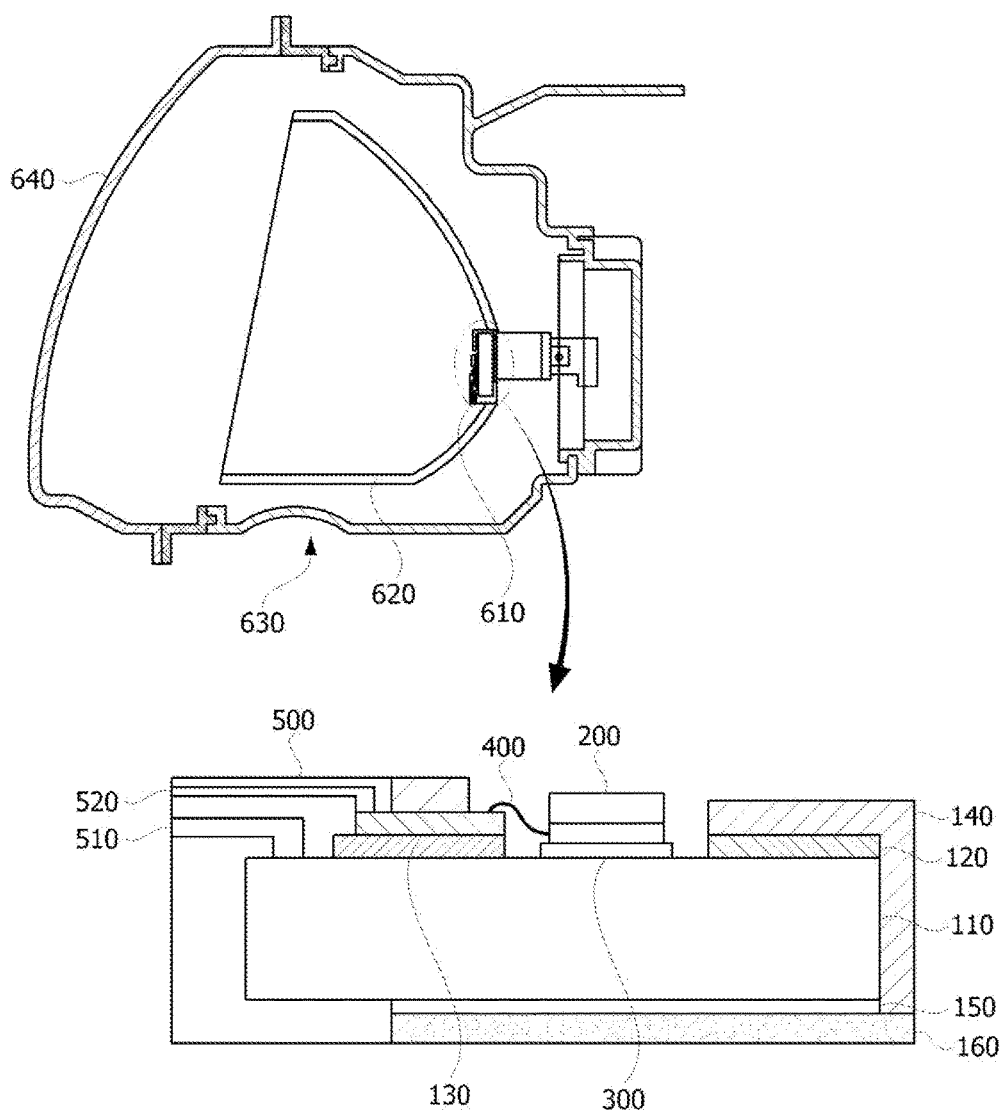
FIG. 9 is a schematic cross-sectional view of a head lamp, for use in a vehicle, to which a light-emitting device according to an embodiment of the present invention is applied.

FIG. 9 is a schematic cross-sectional view of a head lamp, for use in a vehicle, to which a light-emitting device according to an embodiment of the present invention is applied.

Referring to FIG. 9, a head lamp 600 for use in a vehicle according to an embodiment of the present invention may include a light source unit 610, a reflecting part 620, a housing 630, a lens part 640, etc.

The light source unit 610 is provided in the housing 630 and corresponds to the light-emitting device described above. Thus, the light source unit 610 will be briefly described here.

The light source unit 610 may include a PCB 100, at least one luminous element 200 provided on the PCB 100, and an external connector 500 which supplies an external power source to the PCB 100.

The PCB 100 may include a first metal layer 110, a first insulation layer 120 disposed on a region of one surface of the first metal layer 110, a cavity C1 passing through the first insulation layer 120, a second electrode layer 130 disposed on a region of the first insulation layer 120, and a first protective layer 140 disposed on a region of the one surface of the first metal layer 110 having thereon the first insulation layer 120 and the second electrode layer 130. The first protective layer 140 may extend to a side surface of the first metal layer 110.

In the PCB 100, a portion of the first metal layer 110 may be exposed through the cavity C1 passing through the first insulation layer 120. The luminous element 200 may be directly bonded to the portion of the first metal layer 110 exposed through the cavity C1.

A second insulation layer 150 and a second protective layer 160 may be formed on a region of the other surface of the first metal layer 110.

The reflecting part 620 reflects light emitted from the light source unit 610.

Although FIG. 6 illustrates that the reflecting part 620 has a cup shape in which the light source unit 610 is disposed on a bottom surface of the reflecting part 620, the reflecting part 620 is not limited to the cup shape and may be changed in various shapes.

The housing 630 may be coupled to a body of a vehicle (not shown) and may accommodate the light source unit 610 and the reflecting part 620 therein.

The housing 630 has a shape, a side of which is open to emit light emitted from the light source unit 610 to an external side of the housing 630 but may be provided in various other shapes.

The lens part 640 is provided at the open side of the housing 630, and discharges light emitted from the light source unit 610 to the outside of the head lamp 600.

The light emitted from the light source unit 610 is directly emitted to the lens part 640 or is reflected from the reflecting part 620 and then emitted to the lens part 640. The lens part 640 allows the light to pass therethrough and discharge it to the outside of the head lamp 600.

To this end, the lens part 640 may be formed of a transparent glass or plastic material which transmits light.

The lens part 640 may be combined with the housing 630 to block the open side of the housing 630, thereby protecting the light source unit 610 and the reflecting part 620 inside the housing 630. Furthermore, the lens part 640 may prevent foreign substances from flowing into the housing 630.

The head lamp 600 having the structure described above is mounted in a vehicle (not shown) to emit light in a forward or backward direction of the vehicle.

In one embodiment of the present invention, the first electrode layer 110 of the PCB 100 to which the luminous element 200 is directly bonded serves not only as an electrode but also as a heatsink, thereby effectively discharging heat generated by the at least one luminous element 200.

Thus, even if a light-emitting device according to one embodiment of the present invention is applied to the above head lamp 600 which is a high-power product which generates a large amount of heat, a problem caused by low heat radiation performance of the PCB 100 does not occur.

Furthermore, even if a problem occurs in the at least one luminous element 200 or the PCB 100, the at least one luminous element 200 or the PCB 100 may be easily removed from the head lamp 600 since the external connector 500 which is an attachable and detachable type is used. Thus, the at least one luminous element 200 or the PCB 100 in which a problem occurs may be exchanged with another luminous element or another PCB or be repaired in a simple way.

As described above, in a light-emitting device according to the present invention, a ceramic substrate applicable to a luminous element package may be omitted, and an electrode layer which may serve as a basic element of a PCB, perform a heat radiation function, and serve as an electrode may be used.

Thus, a heat discharging path is shorter than when a ceramic substrate is applied to a luminous element package, thereby improving heat radiation performance, and an expensive ceramic substrate is omitted to decrease manufacturing costs. Furthermore, an insulation layer is omitted between a luminous element and a heat dissipation unit, and the heat radiation performance is higher than a method of forming an insulation layer on a PCB and mounting a luminous element according to an insulation layer COB method and without using a ceramic substrate.

Although it is described above that a PCB according to the present invention is applied to a light-emitting device, the present invention is not limited thereto and the PCB according to the present invention is applicable to mounting various semiconductor elements as well a luminous element.

Although exemplary embodiments of the present invention have been described above, it would be apparent to those of ordinary skill in the art that the present invention may be embodied in many different forms without departing from the idea and scope of the present invention defined in the following claims.

The invention claimed is:

1. A printed circuit board, comprising:
a first electrode layer;
a first insulation layer disposed on one surface of the first electrode layer;
a cavity passing through the first insulation layer;
a second electrode layer disposed on the first insulation layer;
a second insulation layer provided on at least a region of the other surface opposite to the one surface of the first electrode layer; and
a first protective layer provided on at least a region of the second insulation layer, wherein at least a portion of the one surface of the first electrode layer is exposed to the outside via the cavity.

2. The printed circuit board of claim 1, wherein, when a semiconductor element is disposed on the one surface of the first electrode layer exposed via the cavity, the first electrode layer discharges heat generated by the semiconductor element to the outside.

3. The printed circuit board of claim 1, comprising a second protective layer provided on at least a region of the one surface of the first electrode layer having thereon the first insulation layer and the second electrode layer.

4. The printed circuit board of claim 3, wherein the second protective layer is provided in a region excluding the cavity.

5. The printed circuit board of claim 3, wherein the second protective layer is provided to cover at least a portion of a side surface of the first electrode layer.

6. The printed circuit board of claim 1, wherein the second insulation layer comprises a heat-conductive insulating material.

7. The printed circuit board of claim 1, wherein the first protective layer comprises aluminum.

8. The printed circuit board of claim 1, comprising a connector provided at a side of the first electrode layer and formed to expose regions of the first and second electrode layers to the outside.

9. The printed circuit board of claim 8, wherein, in the connector, the first insulation layer is formed to expose at least a portion of the one surface of the first electrode layer to the outside.

10. A light-emitting device, comprising:
a printed circuit board comprising:
a first electrode layer;
a first insulation layer provided on one surface of the first electrode layer; and
a second electrode layer provided on the first insulation layer;
at least one luminous element provided on the one surface of the first electrode layer;
a conductive adhesive layer interposed between the one surface of the first electrode layer and the at least one luminous element, wherein one surface of the conductive adhesive layer is directly in contact with the one surface of the first electrode layer and the other surface opposite to the one surface of the conductive adhesive layer is directly in contact with the at least one luminous element; and
a connector provided at a side of the printed circuit board and formed to expose regions of the first and second electrode layers to the outside.

11. The light-emitting device of claim 10, comprising a first protective layer provided on at least a region of the one surface of the first electrode layer having thereon the first insulation layer and the second electrode layer, wherein the first protective layer covers at least a portion of a side surface of the first electrode layer connected to the one surface of the first electrode layer.

12. The light-emitting device of claim 10, wherein the connector is attachable to and detachable from an external connector including first and second electrode terminals, wherein the first electrode terminal of the external connector is in contact with the exposed region of the first electrode layer, and the second electrode terminal of the external connector is in contact with the exposed region of the second electrode layer.

13. The light-emitting device of claim 10, wherein one of an anode terminal or a cathode terminal of the luminous element is electrically connected to the first electrode layer, and the other of the anode terminal or the cathode terminal of the luminous element is electrically connected to the second electrode layer.

14. The light-emitting device of claim 10, wherein the at least one luminous element is provided on the one surface of the first electrode layer via a cavity passing through the first insulation layer.

15. The light-emitting device of claim 10, wherein a plurality of luminous elements is provided on the one surface of the first electrode layer, wherein the plurality of luminous elements is electrically connected in parallel to the first electrode layer and the second electrode layer.

16. The light-emitting device of claim 10, wherein a plurality of luminous elements is provided on the one surface of the first electrode layer, wherein one of an anode terminal and a cathode terminal of each of the plurality of luminous elements is electrically connected in parallel to the first electrode layer, and the other of the anode terminal and the cathode terminal of each of the plurality of luminous elements is electrically connected in parallel to the second electrode layer.

17. A light-emitting device, comprising:
   a printed circuit board comprising:
      a first electrode layer;
      a first insulation layer provided on one surface of the first electrode layer;
      a cavity passing through the first insulation layer;
      a second electrode layer provided on the first insulation layer;
      at least one luminous element provided on the one surface of the first electrode layer via the cavity;
      a second insulation layer provided on at least a region of the other surface opposite to the one surface of the first electrode layer; and
      a protective layer provided on at least a region of the second insulation layer.

18. The printed circuit board of claim 2, wherein a wire of the semiconductor element is bonded onto the second electrode layer.

19. The printed circuit board of claim 18, wherein the second electrode layer includes a bonding pad, and wherein the wire of the semiconductor element is bonded onto the bonding pad.

* * * * *